United States Patent [19]
Nagai et al.

[11] Patent Number: 5,617,435
[45] Date of Patent: Apr. 1, 1997

[54] LASING SYSTEM WITH WAVELENGTH-CONVERSION WAVEGUIDE

[75] Inventors: Hideo Nagai, Osaka; Toru Takayama, Nara; Masahiro Kume, Shiga; Akio Yoshikawa, Kyoto, all of Japan

[73] Assignee: Matsushita Electronics Corporation, Osaka, Japan

[21] Appl. No.: 404,995

[22] Filed: Mar. 16, 1995

[30] Foreign Application Priority Data

Mar. 28, 1994 [JP] Japan .................... 6-057541
Feb. 6, 1995 [JP] Japan .................... 7-017718

[51] Int. Cl.⁶ .................................... H01S 3/10
[52] U.S. Cl. ................ 372/22; 372/92; 372/97; 372/27; 372/5; 372/64; 372/19; 372/98; 372/101; 372/96; 372/102; 372/20
[58] Field of Search ................ 372/21, 22, 92, 372/39, 101, 64, 19, 96, 102, 5, 97, 27, 20, 98

[56] References Cited

U.S. PATENT DOCUMENTS

| | | | |
|---|---|---|---|
| 5,185,752 | 2/1993 | Welch et al. | 372/22 |
| 5,301,059 | 4/1994 | Kitaoka et al. | 372/22 |
| 5,303,247 | 4/1994 | Yamamoto et al. | 372/22 |
| 5,387,998 | 2/1995 | Kitaoka et al. | 372/22 |
| 5,452,312 | 9/1995 | Yamamoto et al. | 372/22 |

OTHER PUBLICATIONS

Risk et al; "Generationm of 425–nm light by waveguide frequency doubling of a GaAlAs laser diode in an extended cavity configuration":Proc. Of Appl. Phys. Lett. 63(23),Dec. 6, 1993,pp. 3134–3136.1993 American Institute Of Phyusics.

W.P. Risk et al., "Generation of 425–nm light by waveguide frequency doubling of a GaAIAs laser diode in an extended–cavity configuration": proc. of Appl. Phys. Lett. 63(23), Dec. 6, 1993, pp. 3134–3136, 1993 American Institute of Physics.

*Primary Examiner*—Leon Scott, Jr.
*Attorney, Agent, or Firm*—McDermott, Will & Emery

[57] ABSTRACT

A semiconductor laser emits semiconductor laser light with TM-mode oscillation. The emitted semiconductor laser light is collimated by a first collimating lens, passes through a Brewster plate that is arranged so that the direction of Brewster plane's p-polarized light is in alignment with the direction of polarization of the emitted semiconductor laser light, and is coupled to an incident portion of a wavelength-conversion waveguide by means of a focusing lens. While being guided through the waveguide, the emitted semiconductor laser light is converted into second-harmonic light by means of a polarization inversion region. Semiconductor laser light emanating from an emitting portion of the waveguide reflects from an output mirror towards a diffraction grating, for modulation in wavelength. Second-harmonic light emanating from the emitting portion of the waveguide is outputted from the output mirror.

11 Claims, 16 Drawing Sheets

○ WITH SELF-SUSTAINED-PULSATION
● WITHOUT SELF-SUSTAINED-PULSATION

SECOND HARMONIC

SEMICONDUCTOR
LASER LIGHT

LASING SYSTEM WITH WAVELENGTH-CONVERSION WAVEGUIDE

BACKGROUND OF THE INVENTION

This invention generally relates to a lasing system employing a wavelength-conversion waveguide within which semiconductor laser light is propagated while at the same time being converted into second-harmonic light. This invention has significant applications in optical recording/reproducing, laser printing, and laser instrumentation.

As the density of optical disks and the quality of laser printing have become higher, semiconductor laser light sources capable of providing a shorter-wavelength output have also been required. Semiconductor laser light sources now in use are capable of emitting red light having a wavelength of up to about 630 nm, and the semiconductor laser industry is now trying to provide an improved semiconductor laser light source capable of producing light (green, blue, and ultraviolet) having a much shorter wavelength.

A short-wavelength lasing system using a semiconductor laser has been proposed. In this system, semiconductor laser light in the near-infrared region emerging from the semiconductor laser is converted into second-harmonic light for emission of blue or ultraviolet laser light.

When generating second harmonic light from a non-linear optical material at high efficiency, it is required to equalize the propagation constant of a fundamental with the propagation constant of a second harmonic. To achieve this generation requirement, $N_\omega$ (i.e., the refractive index to the fundamental) must be equal to $N_{2\omega}$ (the refractive index to the second harmonic). However, for the case of bulk materials, $N_{2\omega}$ is usually greater than $N_\omega$ i.e., $N_{2\omega} > N_\omega$, due to the wavelength dispersion of refractive index. This does not meet the aforesaid second-harmonic light generation requirement.

Where a wavelength-conversion waveguide is used, light travelling within the wavelength-conversion waveguide goes into a native mode having a specified propagation constant. Such a propagation constant depends on the size of wave-length-conversion waveguides. From this fact, a requirement that two times the fundamental propagation constant ($\beta_\omega$) is equal to the second-harmonic propagation constant ($\beta_{2\omega}$) can be met by changing the width and depth of a wavelength-conversion waveguide. When making use of a wavelength-conversion waveguide, greater fundamental/second-harmonic superposition provides higher conversion efficiency and higher fundamental power density and also provides higher conversion efficiency. Therefore, lower modes are preferable.

Recently, a technique has attracted attention in which semiconductor laser light is coupled to a wavelength-conversion waveguide formed on a substrate having a great non-linear optical constant (e.g., a LiNbO$_3$ substrate, a LiTaO$_3$ substrate, and a KTiOPO$_4$ (KTP) substrate) for conversion into second-harmonic light, to accomplish high conversion efficiency.

Referring to FIG. 13, a conventional lasing system employing a wavelength-conversion waveguide will now be described below.

As shown in FIG. 13, semiconductor laser light having a wavelength of 860 nm emitted from a semiconductor laser 50 passes through a collimating lens 51 and a focusing lens 52 and is coupled to an incident portion of a wavelength-conversion waveguide 54 formed in a LiTaO$_3$ substrate 53 having a z-axis facet. This 860 nm-wavelength semiconductor laser light is propagated through the waveguide 54 while at the same time being converted into second-harmonic light having a wavelength of 430 nm by means of a polarization inversion region 55 formed in the LiTaO$_3$ substrate 53.

Both the waveguide 54 and the polarization inversion region 55 are formed on the LiTaO$_3$ substrate 53 by means of proton exchange, and the period of the polarization inversion region 55 is determined by the wavelength of semiconductor laser light to be converted into second-harmonic light.

The period of the polarization inversion region 55 formed by means of proton exchange usually deviates from design values. Therefore, a technique to modulate the wavelength of semiconductor laser light is employed to achieve high conversion efficiency. Since the wavelength of semiconductor laser light is of temperature- and output-dependency, a mechanism capable of performing a certain modulation in wavelength is required to obtain high conversion efficiency.

A collimating lens 56 makes the second-harmonic light from the waveguide 54 parallel and the collimated light is emitted from an output mirror 57. In FIG. 13, however, diffraction/reflection light from a diffraction grating 58 is fed back to the semiconductor laser 50 for modulation in wavelength. By modulating the angle of incidence of semiconductor laser light striking the diffraction grating 58, a modulation in the oscillation frequency of semiconductor laser light can be performed. The reason for the provision of a polarizer 59 between the collimating lens 51 and the focusing lens 52 will be discussed later.

In order to allow the semiconductor laser 50 and the output mirror 57 to act as an external resonant cavity, an emitting portion of the semiconductor laser 50 carries thereon a coating antireflective (AR) to semiconductor laser light and the output mirror 57 carries thereon a coating high-reflective (HR) to semiconductor laser light but antireflective to second-harmonic light. Each end portion of the waveguide 54 carries thereon an AR coating to reduce optical loss.

To accomplish high fundamental-to-second-harmonic conversion performance by means of the waveguide 54 formed in a substrate of LiNbO$_3$, LiTaO$_3$, or KTP, it is necessary to introduce semiconductor laser light with TM (Transverse Magnetic) mode (TM wave: an electromagnetic wave whose polarization direction is in a direction of the z-axis) oscillation, into the waveguide 54.

In the above-described conventional lasing system, semiconductor laser light emitted from the semiconductor laser 50 oscillates in a TE (Transverse Electric) mode (TE wave: an electromagnetic wave whose direction of polarization is within a layer surface). Because of this, when placing the semiconductor laser 50 and the LiTaO$_3$ substrate 53 on respective planes parallelling with each other (see FIG. 15a), the polarization direction of semiconductor laser light crosses orthogonally with respect to the polarization direction of second-harmonic light. As a result, no phase matching is possible (see FIG. 15b) and no conversion from semiconductor laser light to second harmonic light occurs. If, as shown in FIG. 16a, the semiconductor laser 50 and the LiTaO$_3$ substrate 53 are placed on respective planes orthogonally crossing with each other, this aligns the polarization direction of semiconductor laser light with the polarization direction of second-harmonic light (see FIG. 16b). However, due to the fact that the major axis of semiconductor laser light having an ellipse form and the minor axis of second-harmonic light having an ellipse form are in alignment with each other, the drop in coupling efficiency occurs and the conversion efficiency falls.

Accordingly, as a solution to the above problem, a technique has been used. In this technique, semiconductor laser light emitted from the semiconductor laser 50 undergoes a mode conversion from TE mode to TM mode and is coupled to the incident portion of the waveguide 54, to adjust the beam form of semiconductor laser light to the population form of second-harmonic light. One way of subjecting semiconductor laser light to a TE-to-TM conversion is to arrange the polarizer 59 between the collimating lens 51 and the focusing lens 52 (see FIG. 13). Another way is to insert between the collimating lens 51 and the focusing lens 52 a half wave plate 60 capable of producing a phase difference of a half wave length.

However, these two TE-to-TM conversion techniques suffer from respective problems. The first way that makes use of the polarizer 59 produces the problems that the oscillation threshold current of the semiconductor laser 50 is substantially increased and the differential efficiency is decreased because semiconductor laser light oscillates with considerable loss of TE mode components.

The second way that makes use of the half wave plate 60 produces the problems that, since the half wave plate 60 is placed within the external resonant cavity causing transmission loss, the oscillation threshold current of the semiconductor laser 50 is increased and the differential efficiency is decreased.

Both the increase in the oscillation threshold current and the drop in the differential efficiency result in increasing the semiconductor laser operating current.

SUMMARY OF THE INVENTION

Bearing in mind the above-described problems with the prior art techniques, the present invention was made. Accordingly it is an object of the present invention to provide an improved lasing system employing a wavelength-conversion waveguide capable of generating short-wavelength second-harmonic light with no increase in the semiconductor laser oscillation threshold current and no decrease in the differential efficiency.

With a view to accomplishing the aforesaid object, the present invention uses a semiconductor laser as a semiconductor laser light source capable of producing semiconductor laser light that oscillates in TM mode whose direction of polarization agrees with the direction of TM mode of a waveguide.

The present invention provides a first wavelength-conversion waveguide type lasing system. The first lasing system comprises the following: a wavelength-conversion waveguide for having semiconductor laser light propagated therethrough to convert same into second-harmonic light; a semiconductor laser light source for emitting semiconductor laser light with TM mode oscillation from an emitting portion of the semiconductor laser light source; the semiconductor laser light source being arranged in such a way as to align the direction of polarization of the emitted semiconductor laser light with the direction of TM mode of the wavelength-conversion waveguide; a focusing lens for focusing the emitted semiconductor laser light from the semiconductor laser light source on an incident portion of the wavelength-conversion waveguide; and an external resonant cavity capable of resonance of the emitted semiconductor laser light from the semiconductor laser light source.

The aspects of the first lasing system are as follows. In accordance with the first lasing system, no TE-to-TM mode conversion is required thereby preventing loss due to the mode conversion. This enables generation of second-harmonic light with a short wavelength (e.g., blue laser light), with no increase in the operating current of a semiconductor laser light source.

It is preferable that the semiconductor laser light source is formed by a semiconductor laser capable of self-sustained-pulsation thereby producing semiconductor laser light with TM-mode oscillation.

The aspects of such arrangement are as follows. A semiconductor laser that self-sustained-pulsates to produce oscillations is used as a semiconductor laser light source. This eliminates the need for a power source to drive an oscillator that is a cause of unnecessary radiation generation, and neither an oscillator circuit nor a shield mechanism for protection against unnecessary radiation is needed, whereupon a smaller lasing system can be realized.

It is preferable that a Brewster plate is arranged within the external resonant cavity in such a way as to align the direction of Brewster plane's p-polarized light with the direction of polarization of the emitted semiconductor laser light from the semiconductor laser light source.

The aspects of such arrangement are as follows. The transmittance of the Brewster plate with respect to p-polarized semiconductor laser light is 100%, so that the provision of such a Brewster plate causes neither the increase in the oscillation threshold current nor the decrease in the differential efficiency. The operating current of the semiconductor laser light source does not increase and short-wavelength laser light can be produced at high efficiency.

It is preferable that the first lasing system has a band pass filter which is arranged within the external resonant cavity and which has narrow-band-pass characteristics with respect to a wavelength of the emitted semiconductor laser light from the semiconductor laser light source.

The aspects of such arrangement are as follows. The wavelength of the emitted semiconductor laser light from the semiconductor laser light source can be modulated within a narrow bandwidth.

Instead of arranging a band pass filter within the external resonant cavity, a surface of the Brewster plate may carry thereon a band pass filter layer which has narrow-band-pass characteristics with respect to a wavelength of the emitted semiconductor laser light from the semiconductor laser light source.

The aspects of such arrangement are as follows. It becomes possible to prevent the increase in the oscillation threshold current and the decrease in the differential efficiency and modulate the wavelength of semiconductor laser light, with a single device. This makes the lasing system compact in size.

In the first lasing system, it is preferable that the semiconductor laser light source is arranged so that the emitted semiconductor laser light from the semiconductor laser light source strikes an incident portion of the wavelength-conversion waveguide at a Brewster angle.

The aspects of such arrangement are as follows. The increase in the oscillation threshold current and the decrease in the differential efficiency can be prevented, without a Brewster plate.

It is preferable that the focusing lens is formed by a hemispherical lens whose flat end forms a Brewster plane and that the focusing lens is arranged in such a way as to align the direction of Brewster plane's p-polarized light with the direction of polarization of the emitted semiconductor laser light from the semiconductor laser light source.

The aspects of such arrangement are as follows. The focusing lens serves as a Brewster plane. The increase in the oscillation threshold current and the decrease in the differential efficiency can be prevented, without the aid of a Brewster plate.

In the first lasing system, it is preferable that the focusing lens is formed by a first hemispherical lens whose flat end forms a Brewster plane and a second hemispherical lens whose flat end is opposites to the flat end of the first hemispherical lens, and the focusing lens is arranged in such a way as to align the direction of Brewster plane's p-polarized light with the direction of polarization of the emitted semiconductor laser light from the semiconductor laser light source, and the flat end of the second hemispherical lens carries thereon a band pass filter layer which has narrow-band-pass characteristics with respect to a wavelength of the emitted semiconductor laser light from the semiconductor laser light source.

The aspects of such arrangement are as follows. The focusing lens acts as a Brewster plate and as a band pass filter, thereby making the waveguide compact in size. The focusing lens is a spherical lens. Accordingly even when the spherical lens is rotated with respect to the optical axis of the emitted semiconductor laser light, no focal point deviation occurs. With the emitted semiconductor laser light converged at the waveguide, alignment of the direction of Brewster plane's p-polarized light with the direction of polarization of the emitted semiconductor laser light and modulation in the wavelength of the emitted semiconductor laser light can be performed easily.

In the first lasing system, it is preferable that the semiconductor laser light source is a semiconductor laser having an active layer with a real refractive index waveguide structure, or a semiconductor laser having an active layer with a distortion, or a semiconductor laser capable of emitting semiconductor laser light with TM-mode oscillation upon receipt of external semiconductor laser light with oscillation in parallel with TM-mode oscillation, or a DFB (distributed feedback) semiconductor laser.

Such arrangement realizes a semiconductor laser light source capable of producing semiconductor laser light with TM-mode oscillation.

The present invention provides a second wavelength-conversion type lasing system. The second lasing system comprises the following: a wavelength-conversion waveguide for having semiconductor laser light propagated therethrough to convert same into second-harmonic light; a semiconductor laser light source of a surface-emitting semiconductor laser, the semiconductor laser light source being arranged in such a way as to align the direction of polarization of semiconductor laser light emanating from the semiconductor laser light source with the direction of TM mode of the wavelength-conversion waveguide; a focusing lens for focusing the emitted semiconductor laser light from the semiconductor laser light source on an incident portion of the wavelength-conversion waveguide; and an external resonant cavity capable of resonance of the emitted semiconductor laser light from the semiconductor laser light source.

The aspects of the second lasing system are as follows. In accordance with the second lasing system, no TE-to-TM mode conversion is required and loss due to the mode conversion can be prevented. This enables generation of second-harmonic light with a short wavelength (e.g., blue laser light), with no increase in the operating current of semiconductor laser light sources.

DETAILED DESCRIPTION OF THE INVENTION

Preferred embodiments of the present invention will now be described below by making reference to the accompanying drawing figures.

Figure 1:
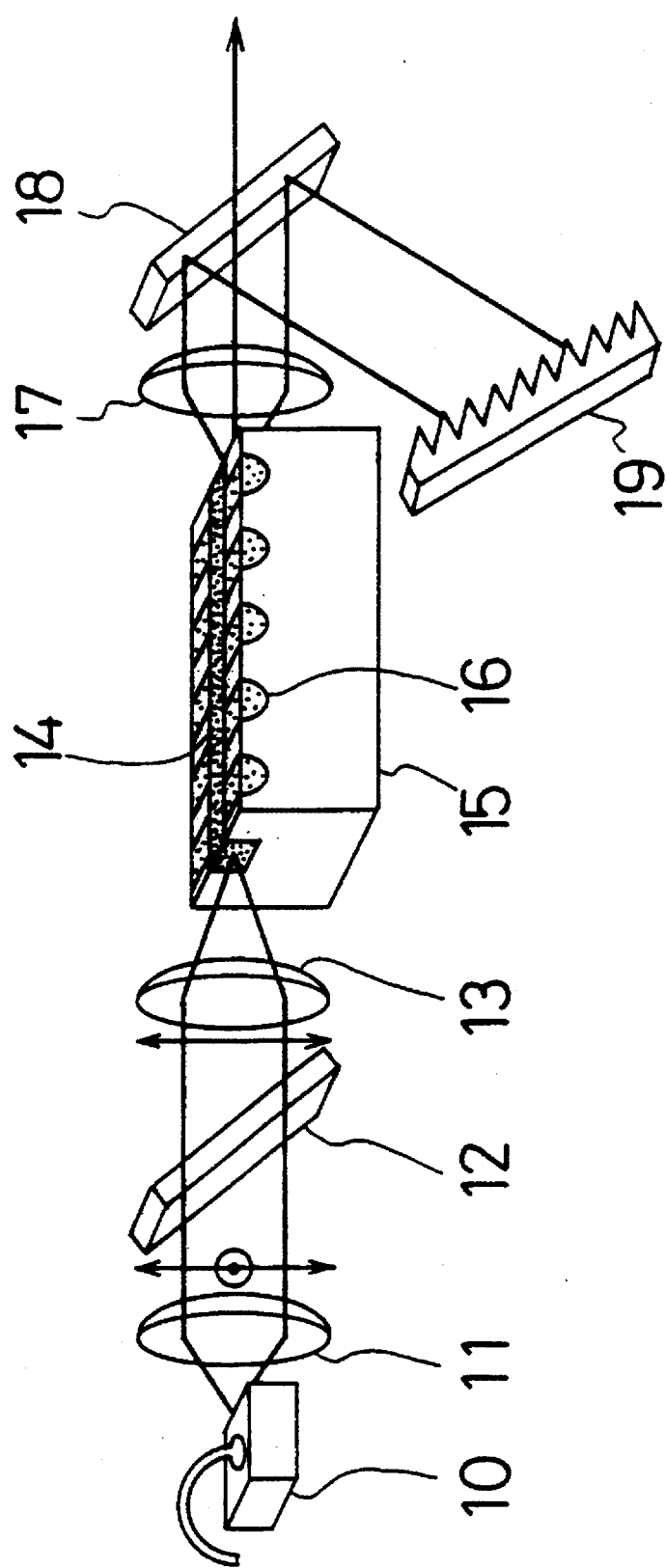
FIG. 1 shows the structure of a wavelength-conversion waveguide type lasing system according to a first embodiment of the present invention.

FIG. 1 schematically illustrates a wavelength-conversion waveguide type lasing system of the first embodiment. A semiconductor laser 10 has an active layer (with an oscillation wavelength of 860 nm) employing a real refractive-index waveguide structure. This semiconductor laser 10 acts as a semiconductor laser light source capable of emitting semiconductor laser light with TM-mode oscillation from its output face. 11 is a first collimating lens for collimating the emitted semiconductor laser light from the semiconductor laser 10. 12 is a Brewster plate of 0.5-mm-thick BK7 glass which is arranged so that the direction of Brewster plane's p-polarized light agrees with the direction of polarization of the emitted semiconductor laser light from the semiconductor laser 10. 13 is a focusing lens for focusing the transmitted semiconductor laser light through the Brewster plate 12 at an incident portion of a wavelength-conversion waveguide 14. The waveguide 14 is formed on a LiTaO$_3$ substrate 15 and has a polarization inversion region 16 for converting the received semiconductor laser light with a wavelength of 860 nm into second-harmonic light with a wavelength of 430 nm. 17 is a second collimating lens for collimating the emitted semiconductor laser light from an emitting portion of the waveguide 14. 18 is an output mirror, and the reflected semiconductor laser light from the output mirror 18 strikes a diffraction grating 19, and second-harmonic light passes through the output mirror 18.

As in the conventional technique previously described, the diffraction grating 19 implements a mechanism for modulating the wavelength of the emitted semiconductor laser light and the emitting portion of the semiconductor laser 10 and the output mirror 18 make up an external resonant cavity. Accordingly the emitting portion of the semiconductor laser 10 carries thereon a coating antireflective to semiconductor laser light and the output mirror 18 carries thereon a coating high-reflective to semiconductor laser light but antireflective to second-harmonic light.

As a general rule, the TE-mode gain is much higher than the TM-mode gain in the semiconductor laser, whereupon oscillation occurs in TE mode. However, if the current density in an active layer is high or if distortion occurs to an active layer, then the TM mode gain increase. As a result, oscillation occurs in both TM and TE modes. That is, by having TE mode damaged, it is feasible to cause only TM-mode oscillation to occur.

In the first embodiment, the Brewster plate 12 is placed within the external resonant cavity to damage the TE mode of the emitted semiconductor laser light from the semiconductor laser 10, to accomplish TM-mode oscillation. This Brewster plate 12 is tilted so that the angle of incidence of a beam of the emitted semiconductor laser light becomes a Brewster angle (an angle of about 56° in the case of BK7 glass). As a result of such an arrangement, the direction of p-polarized light of the Brewster plate 12 is in alignment with the direction of polarization of the emitted semiconductor laser light from the semiconductor laser 10.

The provision of the Brewster plate 12 may be omitted. In this case, the semiconductor laser 10 is arranged so that the emitted semiconductor laser light from the semiconductor laser 10 strikes the incident portion of the waveguide 14 at a Brewster angle.

The semiconductor laser 10 is arranged so that the direction of polarization of the emitted semiconductor laser light in TM mode agrees with the direction of TM mode of the waveguide 14.

Figure 2:
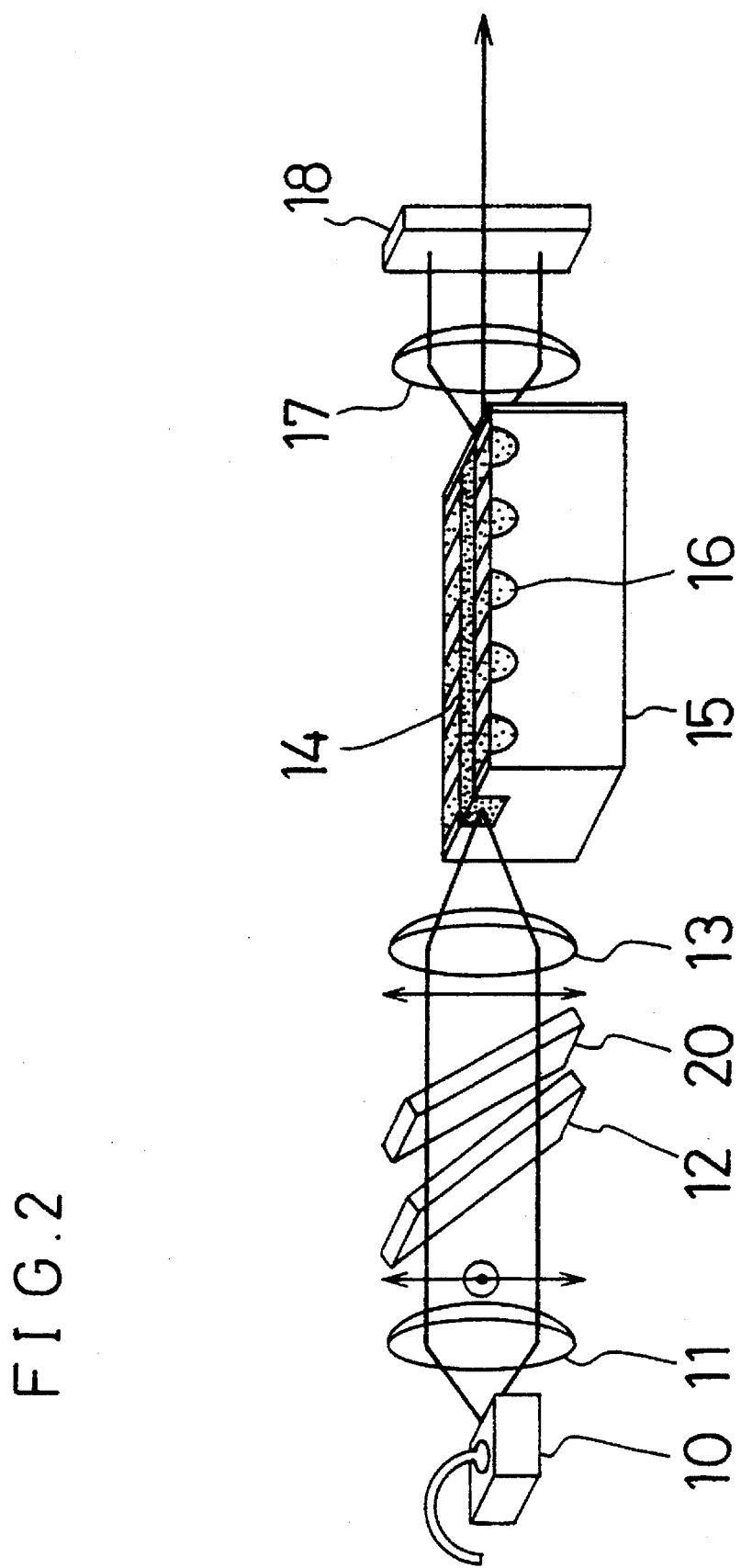
FIG. 2 shows the structure of a wavelength-conversion waveguide type lasing system according to a second embodiment of the present invention.

FIG. 2 shows the structure of a wavelength-conversion waveguide type lasing system according to the second embodiment. Note that in the second embodiment the same reference numerals are applied to like components and they are not described.

A feature of the second embodiment is a band pass filter 20 for performing the wavelength modulation of semiconductor laser light. In the first embodiment, the diffraction grating 19 is used for wavelength modulation. In the second embodiment, on the other hand, the band pass filter 20, which has narrow-band-pass characteristics with respect to 860-nm semiconductor laser light, is inserted between the Brewster plate 12 and the focusing lens 13. The band pass filter 20 is prepared by forming on one surface of BK7 glass a multilayered dielectric film having narrow-band-pass characteristics with respect to semiconductor laser light with a wavelength of about 860 nm and applying to the other surface an AR (antireflective) coating. The wavelength modulation of the emitted semiconductor laser light can be performed by adjusting the angle of incidence of a semiconductor laser light beam striking the band pass filter 20.

In the second embodiment, the semiconductor laser 10 and the output mirror 18 make up an external resonant cavity. Accordingly the emitting portion of the semiconductor laser 10 carries thereon a coating antireflective to semiconductor laser light and the output mirror 18 carries thereon a coating high-reflective to semiconductor laser light but antireflective with respect to second-harmonic light.

Figure 3:
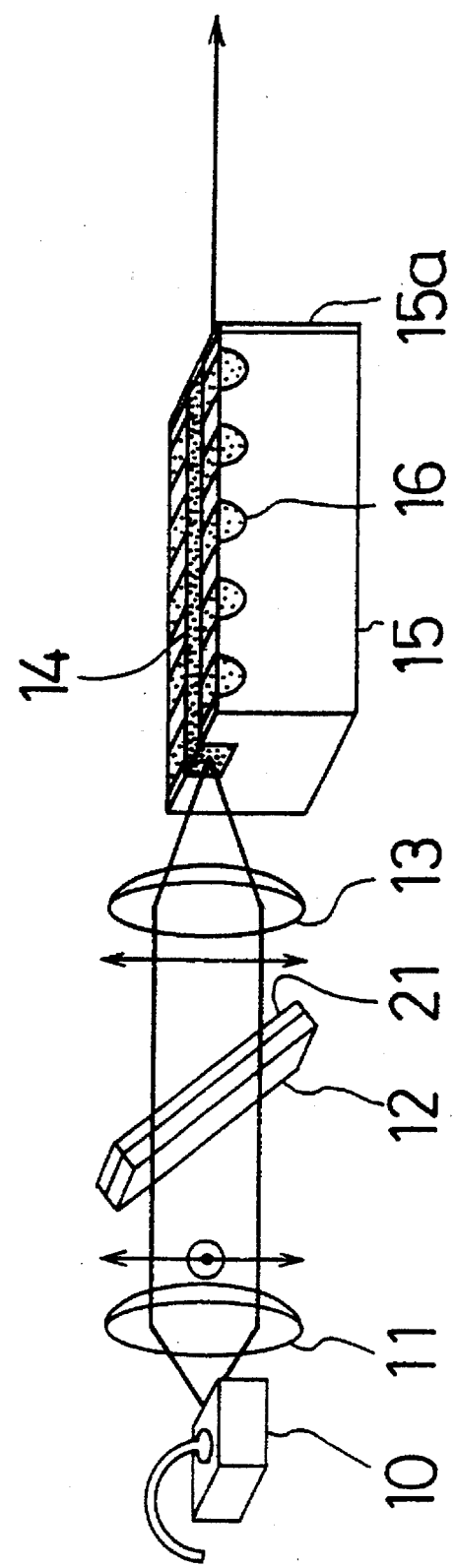
FIG. 3 shows the structure of a wavelength-conversion waveguide type lasing system according to a third embodiment of the present invention.

FIG. 3 shows the structure of a wavelength-conversion waveguide type lasing system according to the third embodiment. Note that in the third embodiment the same reference numerals are applied to like components and they are not described.

Figure 6:
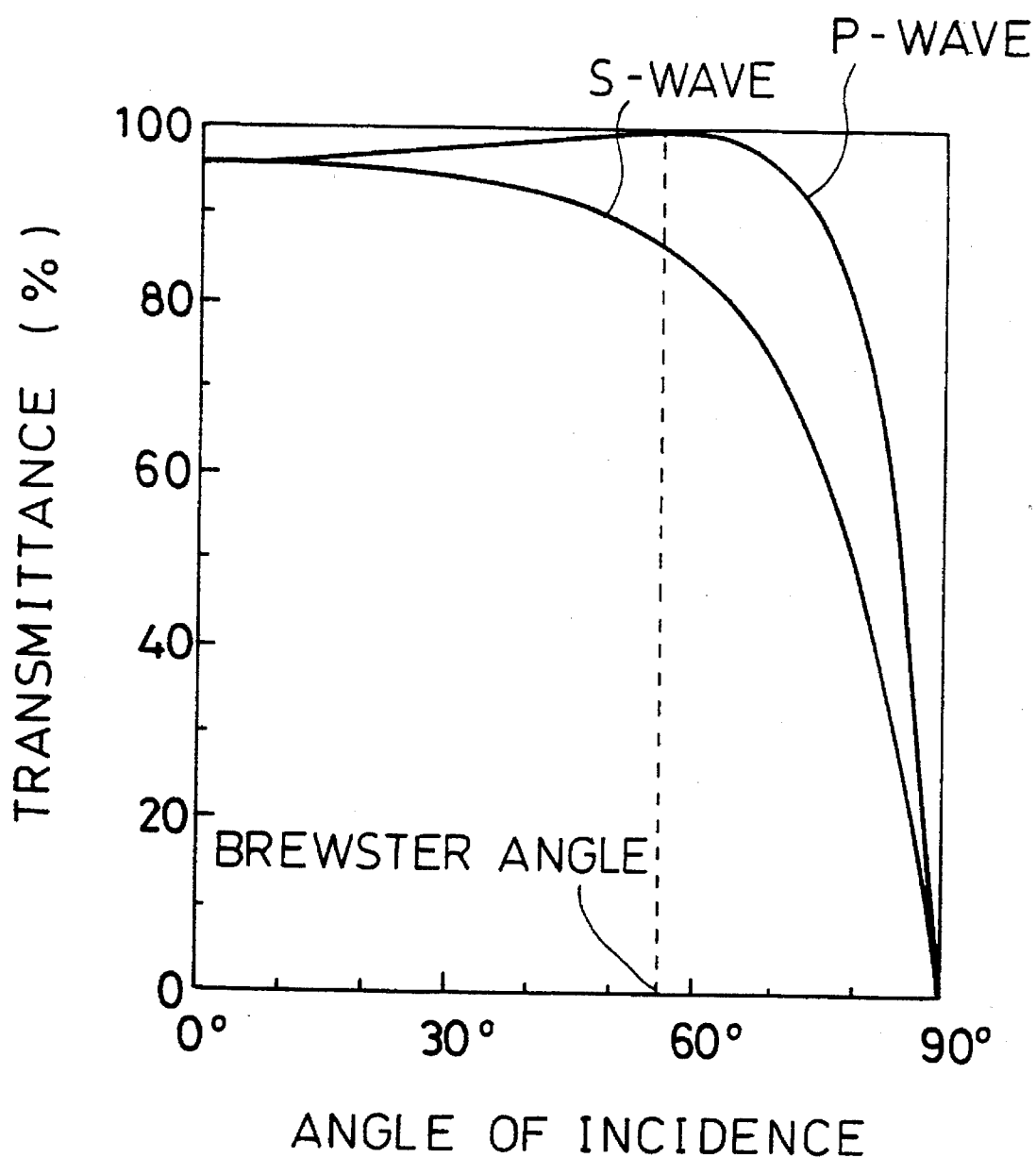
FIG. 6 is a graph showing the transmittance of a Brewster plate, used in the first to fourth embodiments, with respect to p-polarized light.

A feature of the third embodiment is as follows. In order to make a wavelength-conversion waveguide type lasing system compact in size by providing a simple optical system without no damage to the function of the second embodiment, a band pass filter layer 21 is formed on a surface of the Brewster plate 12 on the side of the LiTaO$_3$ substrate 15. That is, while one surface of the Brewster plate 12 on the side of the semiconductor laser 10 bears nothing, the other surface on the side of the LiTaO$_3$ substrate 15 is coated with a multilayered dielectric film having narrow-band-pass characteristics with respect to semiconductor laser light with a wavelength of about 860 nm. As is shown in FIG. 6, the transmittance of the Brewster plate 12 with respect to the p-polarized light, on the one hand, is almost 100% in the vicinity of the Brewster angle, and the transmittance of the Brewster plate 12 with respect to s-polarized light, on the other hand, suffers 10-odd % loss in comparison with the p-polarized light. This means that in the vicinity of the Brewster angle a most adequate band pass characteristic can be obtained by slightly changing the angle of incidence of semiconductor laser light, with no functional loss to the Brewster plate 12. Semiconductor laser light can be wavelength-modulated by means of a single device, keeping the transmittance of the Brewster plate 12 with respect to the p-polarized light at around 100%.

In the third embodiment, the semiconductor laser 10 and the emitting portion 15a of the waveguide 14 make up an external resonant cavity. Accordingly the emitting portion of the semiconductor laser 10 carries thereon a coating antireflective to semiconductor laser light and the emitting portion 15a of the waveguide 14 carries thereon a coating high-reflective to semiconductor laser light but antireflective to second-harmonic light.

Figure 4:
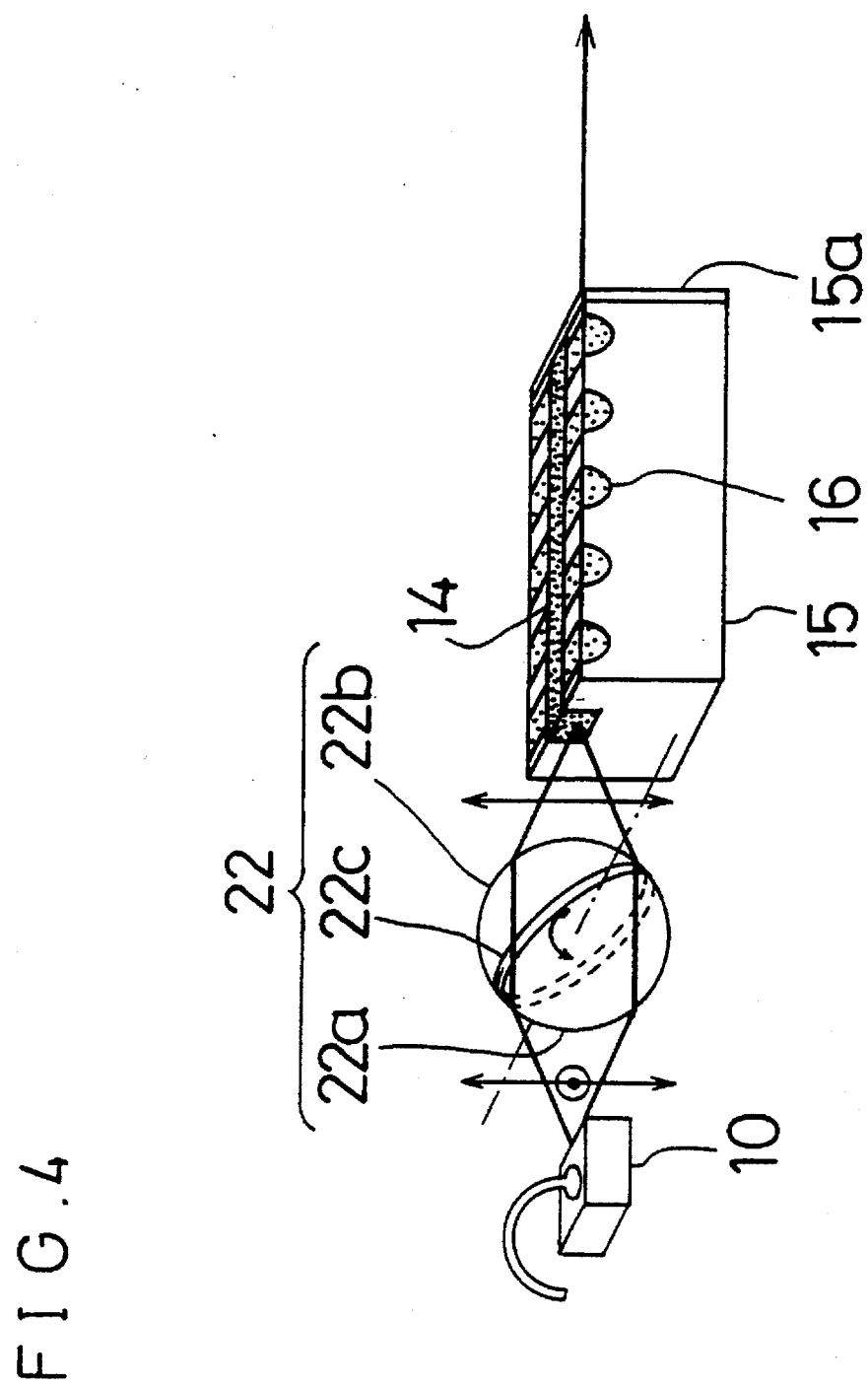
FIG. 4 shows the structure of a wavelength-conversion waveguide type lasing system according to a fourth embodiment of the present invention.

FIG. 4 shows the structure of a wavelength-conversion waveguide type lasing system according to the fourth embodiment. Note that in the fourth embodiment the same reference numerals are applied to like components and they are not described.

A feature of the fourth embodiment is as follows. In order to make a wavelength-conversion waveguide type lasing system compact in size by providing a simpler optical system with no damage to the function of the second embodiment, the first collimating lens 11, the Brewster plate 12, the band pass filter 20, and the focusing lens 13 are replaced with a microspherical lens 22.

Figure 5:
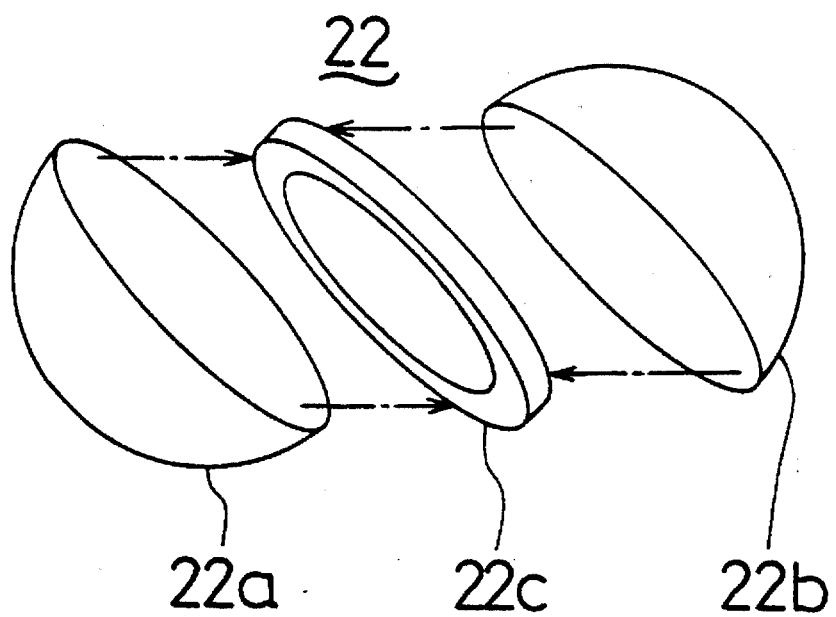
FIG. 5 is a view illustrating parts of a microspherical lens used in the fourth embodiment.

FIG. 5 illustrates parts of the microspherical lens 22. The microspherical lens 22 is made up of first and second hemispherical lenses 22a and 22b each of which is formed by BK7 glass and has a diameter of 5 mm and an annul at spacer 22c with a thickness of about 0.1 mm. The spacer 22c integrally joints the first and second hemispherical lenses 22a and 22b to form the microspherical lens 22. The first hemispherical lens 22a has a flat end surface forming a Brewster plane. The second hemispherical lens 22b has a flat end surface which is coated with a multilayered dielectric film having narrow-band-pass characteristics with respect to semiconductor laser light with a wavelength of about 860 nm. The microspherical lens 22 is placed so that the direction of p-polarized light of the flat end surface (i.e., the Brewster plane) of the First hemispherical lens 22a is in alignment with the direction of polarization of the emitted semiconductor laser light from the semiconductor laser 10.

In order to collect beams of the emitted semiconductor laser light from the semiconductor laser 10 at the incident portion of the waveguide 14, the microspherical lens 22 is arranged so that both the flat end surfaces of the first and second hemispherical lenses 22a and 22b are tilted at a Brewster angle with respect to the emitted semiconductor laser light from the semiconductor laser 10. The emitted semiconductor laser light from the semiconductor laser 10 is wavelength-modulated by rotating the microspherical lens 22. In the fourth embodiment, the microspherical lens 22 is spherical. Accordingly even when the microspherical lens 22 is rotated with respect to the optical axis of the emitted semiconductor laser light, no focal point deviation occurs. Accordingly, wavelength modulation can be performed, with beams of the emitted semiconductor laser light converged at the waveguide 14.

Figure 7:
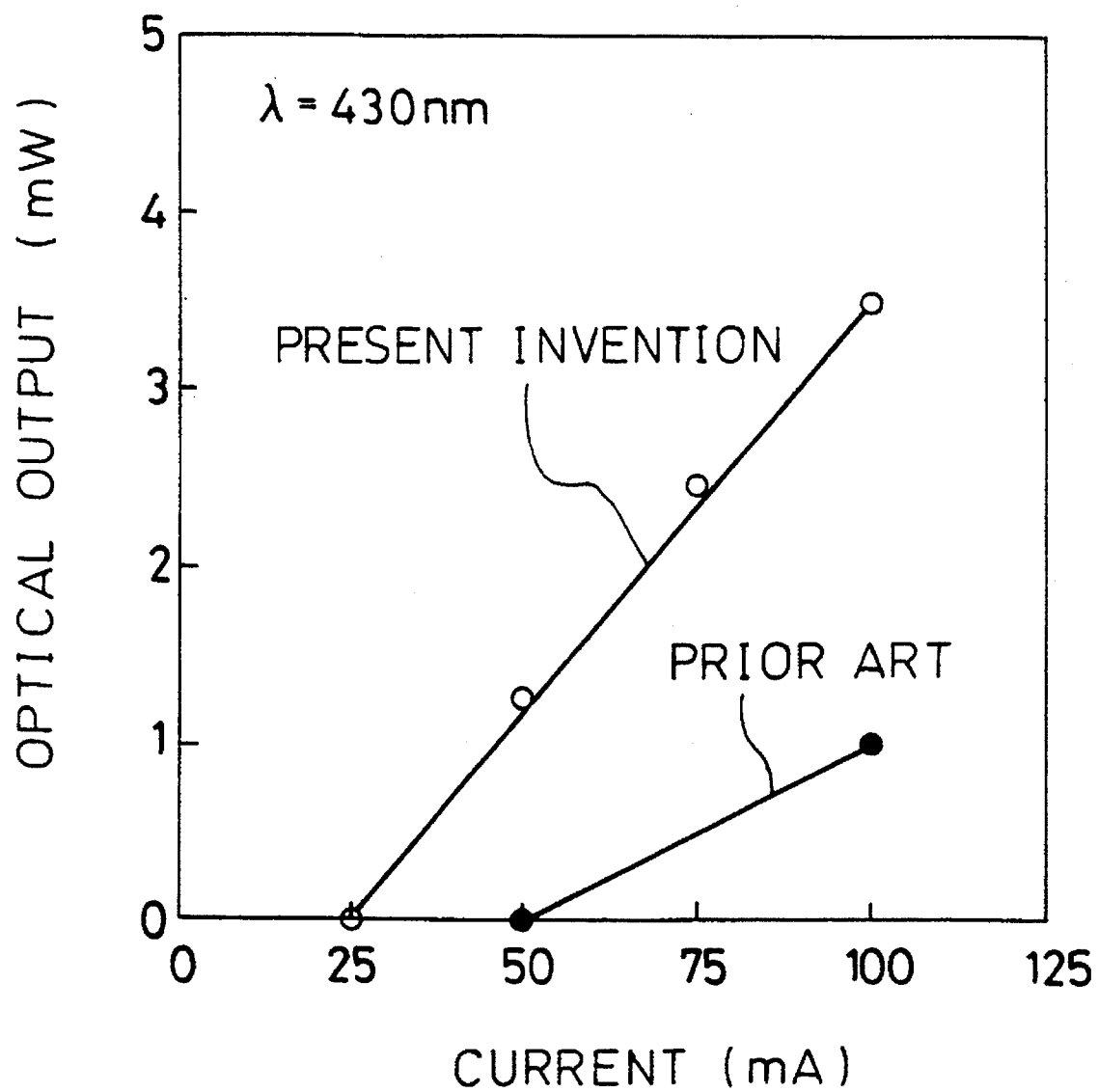
FIG. 7 is a graph showing the input/output characteristic of the FIG. 4 lasing system.

FIG. 7 compares the I/O characteristic of a wavelength-conversion waveguide type lasing system of the fourth embodiment with the I/O characteristic of a conventional wavelength-conversion waveguide type lasing system. With the fourth embodiment lasing system, blue laser light of 3.5 mW was obtained when the operating current is 100 mA.

In the first to fourth embodiments, the waveguide 14 is formed in the LiTaO$_3$ substrate 15. However, the waveguide 14 may be formed in any other functionally equivalent substrate of non-linear optical crystal, e.g., LiNbO$_3$ and KTP.

In the first to fourth embodiments, the semiconductor laser 10 driven by a pulse power source is used. However, in the fifth to seventh embodiments described below, another type of semiconductor laser is used which is driven by a dc power source to pulse-oscillate, or self-sustained-pulsate to produce oscillations.

As a general rule, the efficiency of conversion into second-harmonic light is proportional to the power density of a fundamental. That is, greater fundamental output, i.e., semiconductor laser light output, provides higher conversion efficiency. In semiconductor lasers, pulse driving achieves higher output in comparison with CW (continuous wave) driving. Accordingly, where the repetitive pulse frequency is sufficiently high (above hundreds of MHz), use of a semiconductor laser driven by a pulse power source is preferable because higher conversion efficiency is obtained.

In order to have a semiconductor laser emit semiconductor laser radiation at high efficiency, the semiconductor laser must be driven by electric current with a large amplitude. However, an oscillator power source, which drives a semiconductor laser at a high frequency with a large amplitude electric current, produces unwanted radiation which must be eliminated. It is not practically possible, when considering space available, for a general semiconductor lasing system to built therein a shielding means against such unwanted radiation.

In view of the above, a semiconductor laser which is driven by a dc power source and which pulse-oscillates is employed in the fifth to seventh embodiments.

Figure 8:
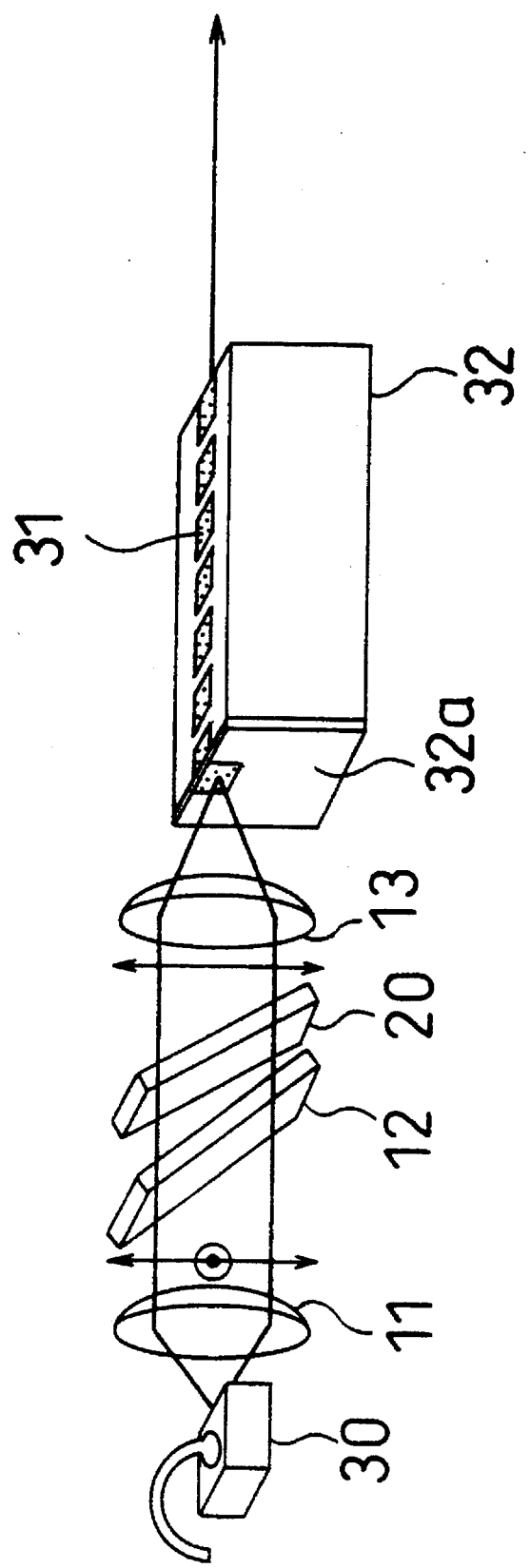
FIG. 8 shows the structure of a wavelength-conversion waveguide type lasing system according to a fifth embodiment of the present invention.

FIG. 8 shows the structure of a wavelength-conversion waveguide type lasing system according to the fifth embodiment. Note that in the fifth embodiment the same reference numerals are applied to like components and they are not described.

A feature of the fifth embodiment is that a semiconductor laser 30 is used which self-sustained-pulsates to produce oscillations. This eliminates the need for providing an oscillator power source to pulse-drive a semiconductor laser and the problem of unwanted radiation can be solved. Additionally, an oscillator circuit becomes unnecessary, therefore making a wavelength-conversion waveguide type lasing system compact in size.

A pulse oscillation type semiconductor laser (hereinafter referred to as self-sustained-pulsation type semiconductor laser) with a gain waveguide structure, used as a light source for CD players and the like, is usually in the self-sustained-pulsation state when the average output is below about 5 mW (the pulse-peak output is somewhere around 20 mW). However, if the average output exceeds 5 mW, then the semiconductor laser stops self-sustained-pulsating thereby producing no oscillations. Conversely, in accordance with the present embodiment, the semiconductor laser 30 employs a real refractive index waveguide structure so that it can continuously self-sustained-pulsate to produce oscillations until the average output reaches hundreds of mW (the pulse-peak output is somewhere around 1 W). As described above, the efficiency of conversion into second-harmonic light is proportional to the power density of a fundamental. Accordingly, as a light source suitable for a wavelength-conversion waveguide type lasing system, a semiconductor laser employing a real refractive index waveguide structure is preferable because of its high pulse output ability. The semiconductor laser 30 has an active layer (with an oscillation wavelength of 860 nm) with a real refractive index waveguide structure.

Figure 11:
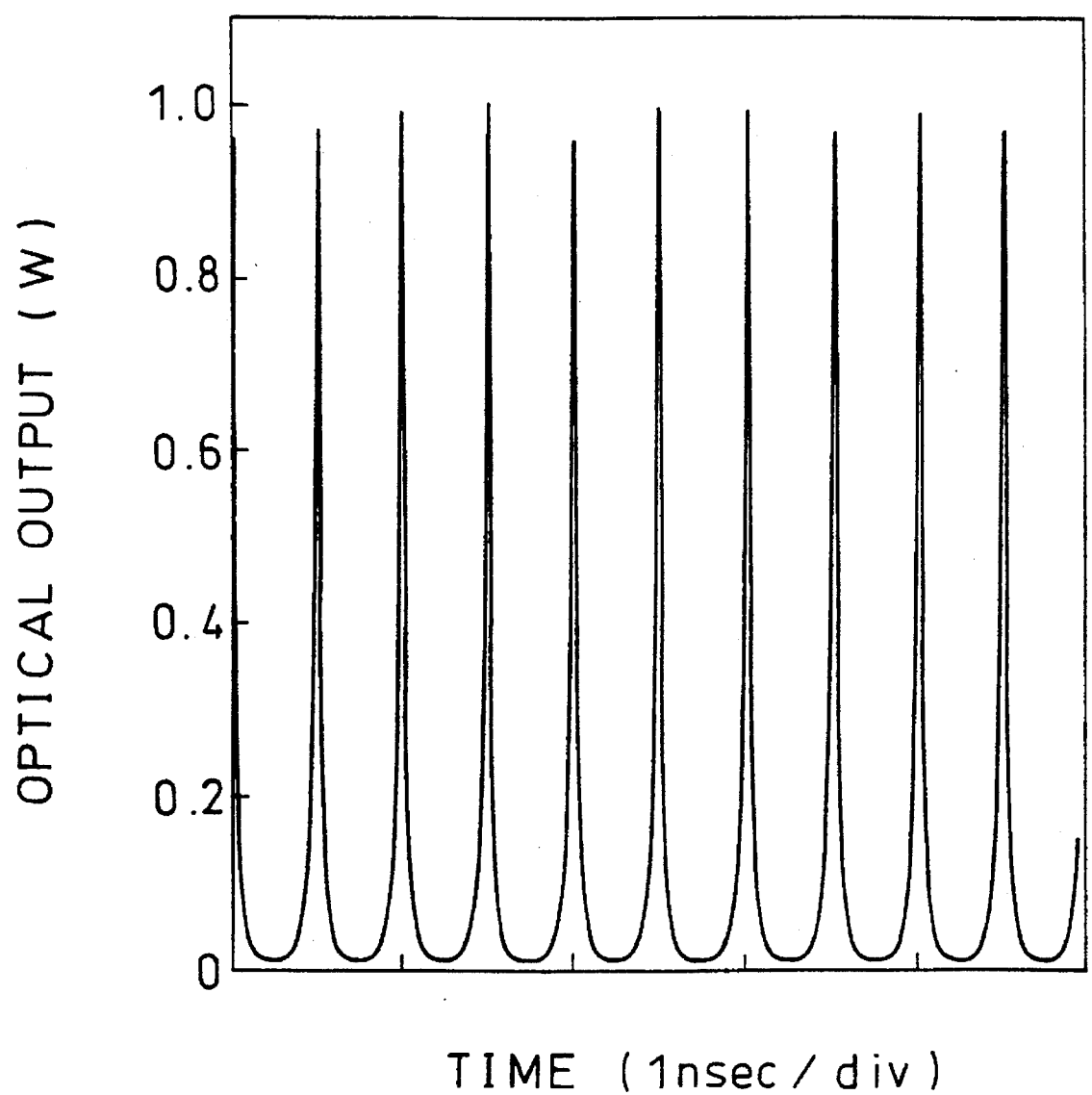
FIG. 11 is a graph showing optical output waves of a semiconductor laser that self-sustained-pulsates to produce oscillations according to the fifth to seventh embodiments.

FIG. 11 shows optical output waveforms of the semiconductor laser 30 of a self-sustained-pulsation type, wherein the pulse-peak output is 1 W (the average output=100 mW) and the pulse frequency is 2 GHz.

In the fifth embodiment, a wavelength-conversion waveguide 31 is formed by means of periodical replacement of Ka ions of a KTP substrate 32 with Rb ions. In the KTP substrate 32 the ion exchange of Ka→Rb takes place. In a substrate of LiNbO$_3$ or LiTaO$_3$ the ion exchange of Li→H takes place. The waveguide 31 is formed on the z-plane of the KTP substrate 31 in order that ion diffusion in the z-axis direction perpendicular to the substrate surface occurs faster than that in the x- or y-axis direction parallel with the substance surface. Since crystals of the KTP substrate 31 are positive-birefringent crystals, the refractive index in the z-axis direction is greater than that in the x- or y-axis direction. Crystals of the KTP substrate 31 have a high non-linear optical constant in relation to the z-axis.

In the fifth embodiment, the semiconductor laser 30 and the waveguide 31 make up an external resonant cavity. Accordingly the emitting portion of the semiconductor laser 30 carries thereon a coating antireflective to semiconductor laser light and an incident portion 31a of the waveguide 31 carries thereon a coating high-reflective to semiconductor laser light but antireflective to second-harmonic light.

As in the second embodiment, the semiconductor laser 30 is arranged so that the polarization direction of the emitted semiconductor laser light in TM mode from the emitting portion of the semiconductor laser 30 agrees with the direction of TM-mode of the waveguide 31.

The Brewster plate 12 is arranged so that the angle of incident of the emitted semiconductor laser light becomes a Brewster angle. Because of this arrangement, the direction of p-polarization in relation to the Brewster plate 12 agrees with the direction of polarization of the emitted semiconductor laser light from the semiconductor laser 30.

The oscillation state of the semiconductor laser 30 is a multi-longitudinal mode. If, like the fifth embodiment, the band pass filter 20 having a narrow-band-pass characteristic is arranged within the external resonant cavity, this allows the semiconductor laser 30 to produce semiconductor laser light with a wavelength selected by the band pass filter 20 in a single longitudinal mode oscillation.

Figure 12:
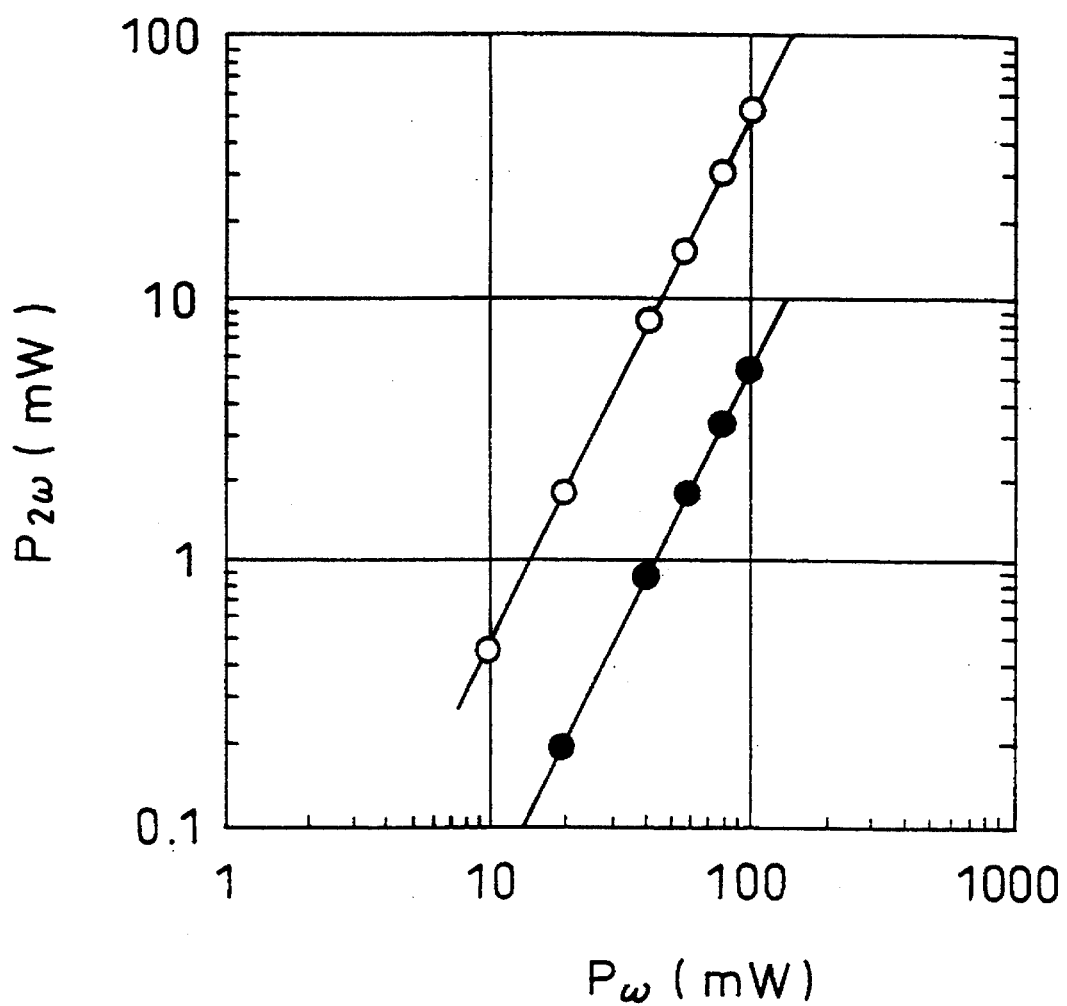
FIG. 12 is a graph showing the input/output characteristic of the FIG. 8 lasing system employing a self-sustained-pulsation semiconductor laser and the input/output characteristic of a lasing system employing a non-self-sustained-pulsation semiconductor laser.
Figure 13:
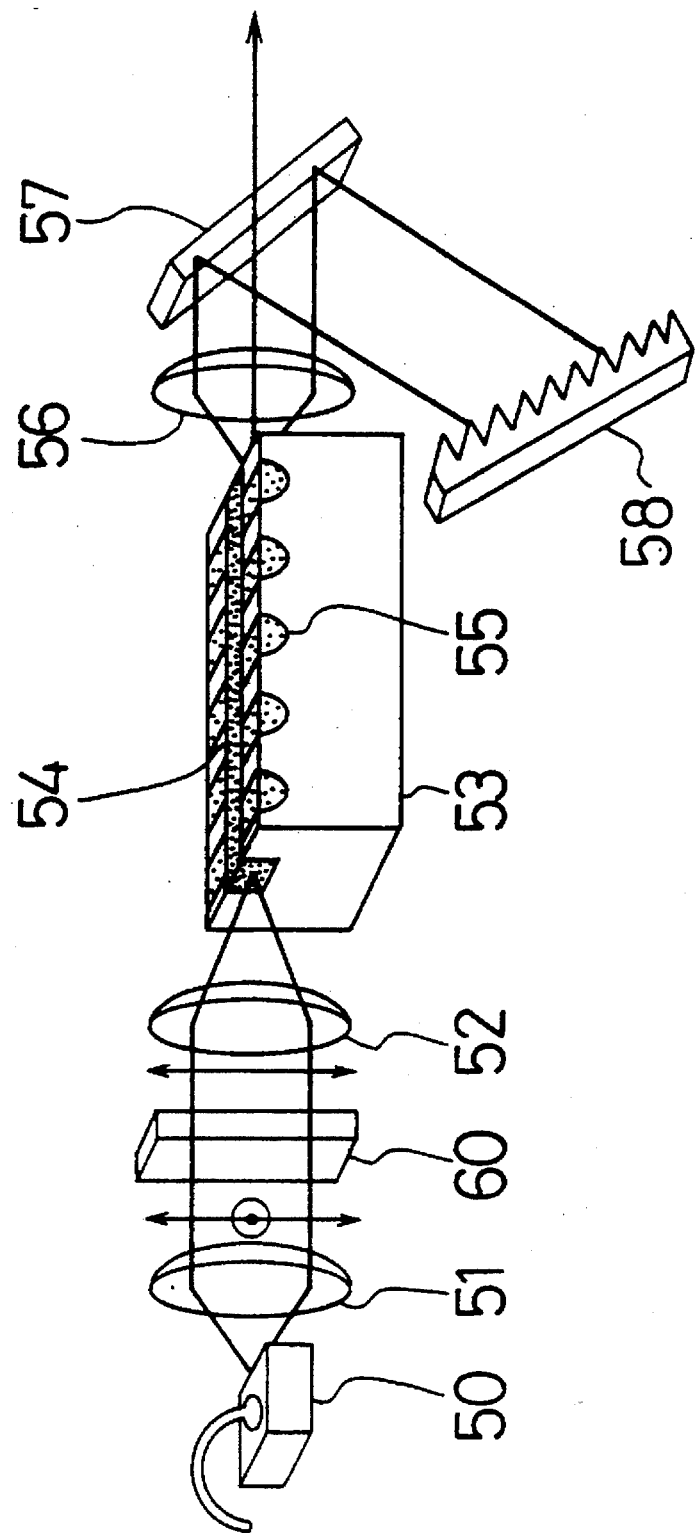
FIG. 13 shows the structure of a conventional wavelength-conversion waveguide type lasing system.
Figure 14:
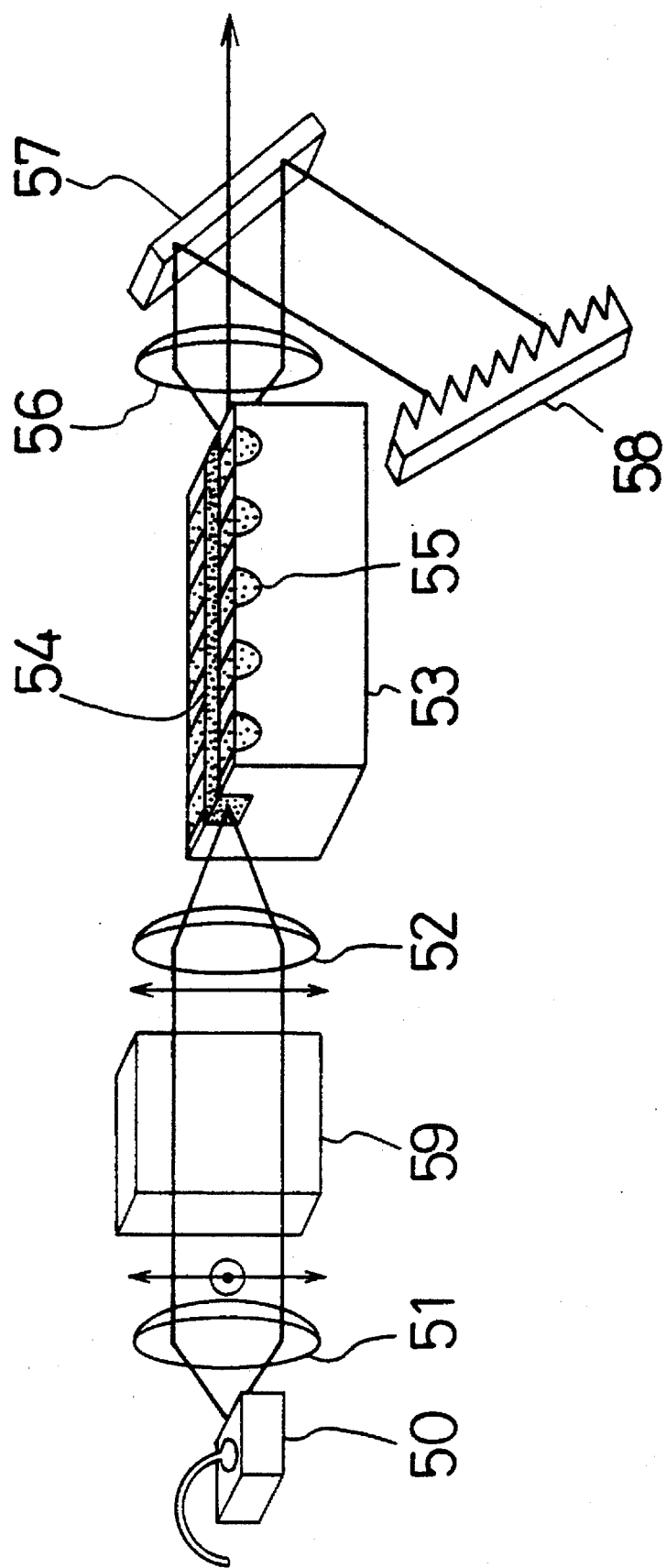
FIG. 14 shows the structure of a conventional wavelength-conversion waveguide type lasing system.
Figure 15A:
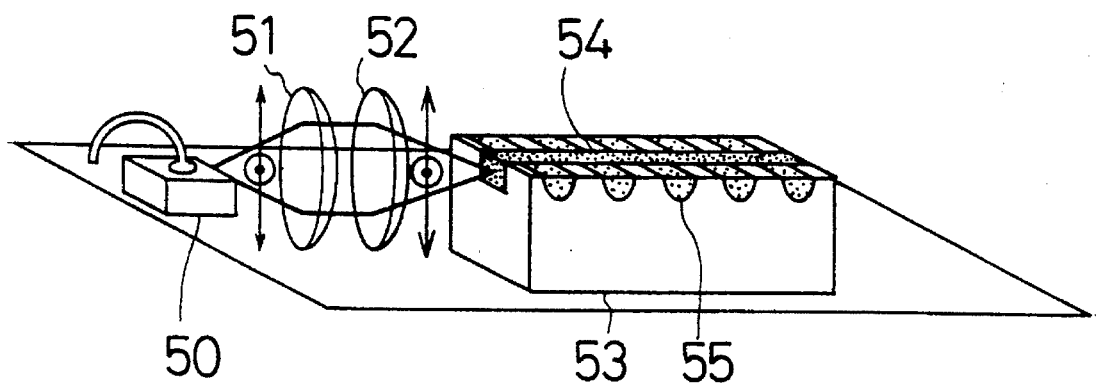
FIG. 15a shows the structure of a conventional wavelength-conversion waveguide type lasing system and FIG. 15b shows the direction of polarization of semiconductor laser light and the direction of polarization of second-harmonic light in the FIG. 15a lasing system.
Figure 15B:
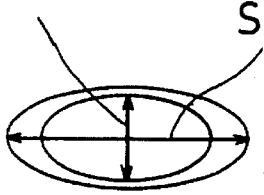
Figure 16A:
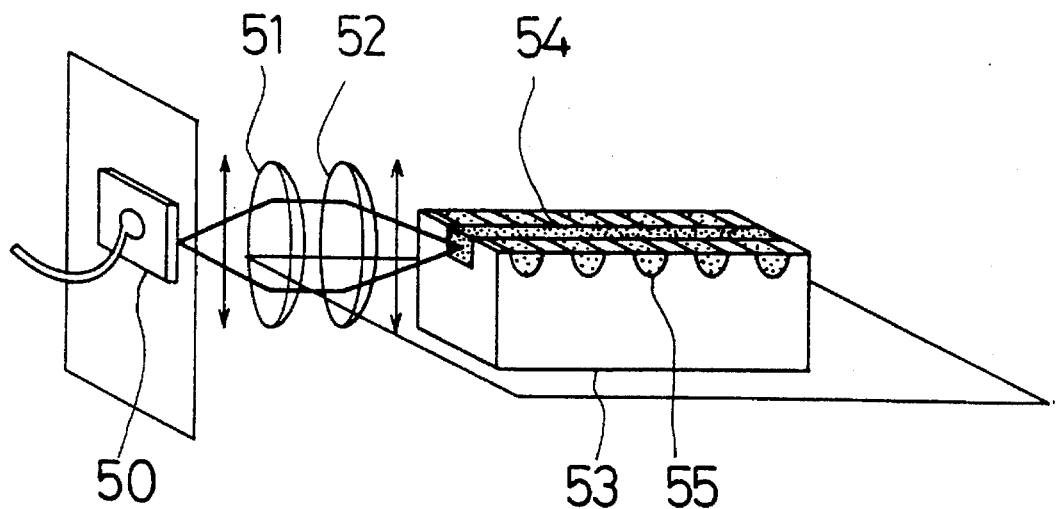
FIG. 16a shows the structure of a conventional wavelength-conversion waveguide type lasing system and FIG. 16b shows the direction of polarization of semiconductor laser light and the direction of polarization of second-harmonic night in the FIG. 15a lasing system.
Figure 16B:
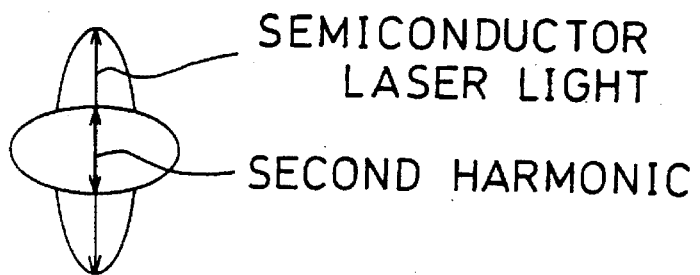

FIG. 12 is a graph comparing the I/O characteristic of a wavelength-conversion waveguide type lasing system of the fifth embodiment with the I/O characteristic of a wavelength-conversion waveguide type lasing system employing a CW-oscillation semiconductor laser of a non-self-sustained-pulsation type, the former being indicated with symbol ○ and the latter being indicated with symbol ●. The abscissa indicates the average output of the semiconductor laser 30 serving as input ($P_\omega$) to the waveguide 31 and the ordinate indicates the average output of the second-harmonic light from the waveguide 31 ($P_{2\omega}$).

In the case of the non-self-sustained-pulsation semiconductor laser, when its output is 100 mW, the second-harmonic light output from the waveguide 31 is 5 mW. On the other hand, in the case of the self-sustained-pulsation semiconductor laser of the fifth embodiment, when its average output is 100 mW, the second-harmonic light output from the waveguide 31 is 50 mw. To sum up, use of the self-sustained-pulsation semiconductor laser provides tenfold conversion efficiency.

If a semiconductor laser self-sustained-pulsates to produce oscillations, this causes second-harmonic light to be modulated at the same frequency (several GHz) as the fundamental's oscillation frequency. However, this will not produce any problems in applying a lasing system of the present embodiment to an optical disk, since the frequency of second-harmonic light is much higher than the signal frequency of an optical disk.

Wavelength-conversion waveguide type lasing systems must be made compact in size when used as a light source for optical disks.

Figure 9:
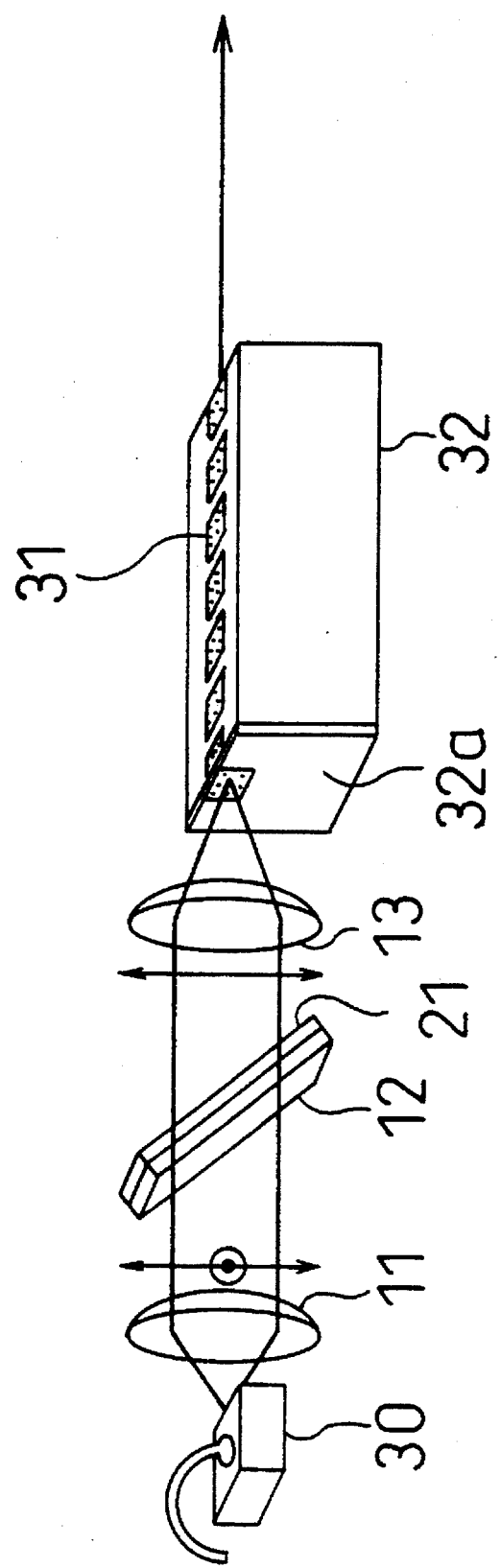
FIG. 9 shows the structure of a wavelength-conversion waveguide type lasing system according to a sixth embodiment of the present invention.

FIG. 9 shows the structure of a wavelength-conversion waveguide type lasing system of the sixth embodiment which is made compact in size by employing a simple optical system with no damage to the function of the second embodiment. The sixth embodiment is a lasing system as a result of a combination of the third and fifth embodiments. Note that in the sixth embodiment the same reference numerals are applied to like components and they are not described.

Figure 10:
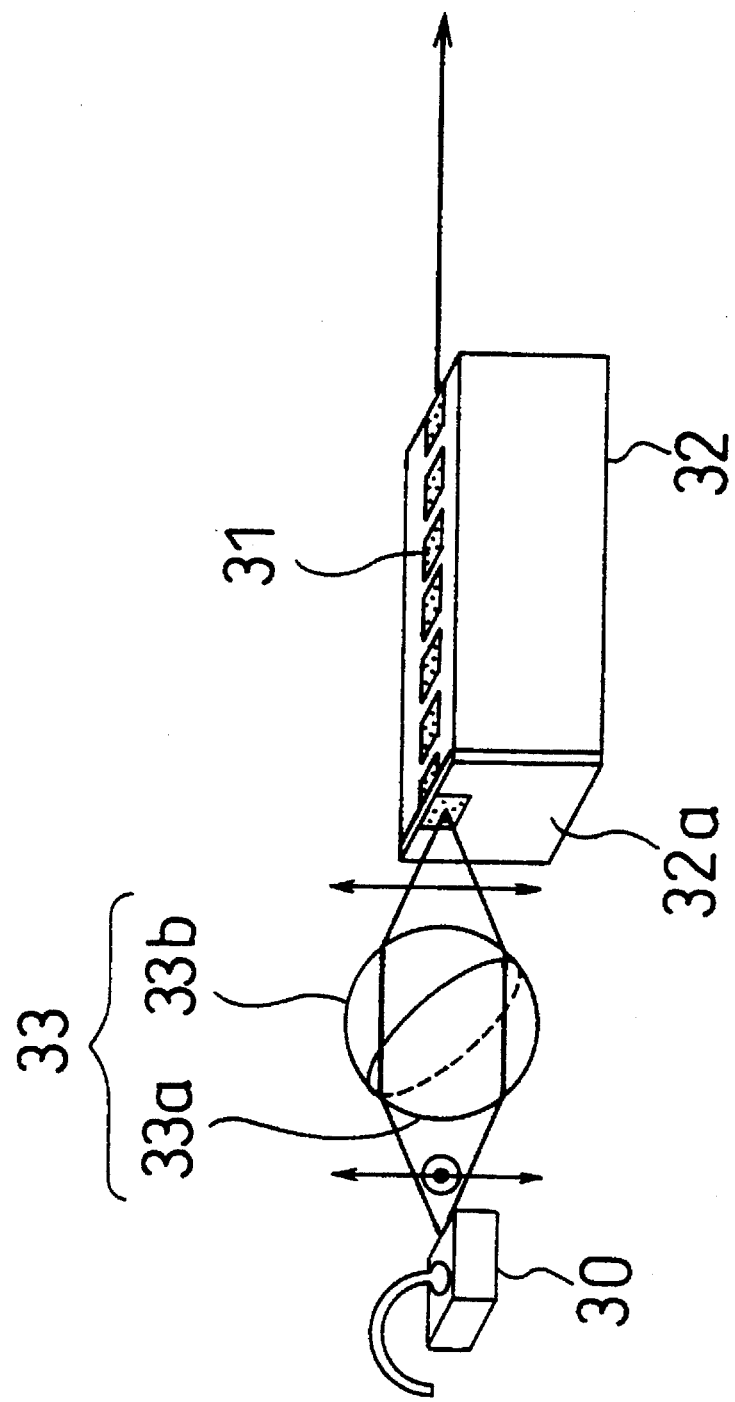
FIG. 10 shows the structure of a wavelength-conversion waveguide type lasing system according to a seventh embodiment of the present invention.

FIG. 10 shows the structure of a wavelength-conversion waveguide type lasing system of the seventh embodiment which is made compact in size by employing a simple optical system with no damage to the function of the fifth embodiment.

The seventh embodiment uses a microspherical lens 33 having a diameter of 5 mm. This microspherical lens 33 combines the functions of the first collimating lens 11, the Brewster plate 12, the band pass filter 20, and the focusing lens 13 of the fifth embodiment. The microspherical lens 33 differs from the microspherical lens 33 in that the former is not provided with the spacer 22c. A first hemispherical lens 33a and a second hemispherical lens 33b make up the microspherical lens 33 in the form of a true sphere. As in the fourth embodiment, the first hemispherical lens 33a of BK7 glass has a flat end surface acting as a Brewster plane. The second hemispherical lens 33b has a flat end surface which is coated with a multilayered dielectric film having narrow-band-pass characteristics with respect to semiconductor laser light with a wavelength of about 860 nm.

Both the sixth embodiment and the seventh embodiment provide the same performance that the fifth embodiment provides.

In each embodiment, BK7 glass is used as a material for the Brewster plate 12, the band pass filter 20, and the microspherical lenses 22, 33. Other functionally equivalent materials (e.g., optical glass other than BK7, optical resin, and organic compounds) may be used, with the same effect.

In each embodiment, each semiconductor laser 10, 30 is a semiconductor laser having an active layer of a real refractive index waveguide structure. In such a semiconductor laser, a material that becomes transparent upon exposure to semiconductor laser light is used to form a current narrow-band layer, to reduce optical loss. The difference in gain between TE mode and TM mode becomes so small that TM-mode oscillation can be obtained.

Instead of using a semiconductor laser having an active layer of a real refractive index waveguide structure, either a semiconductor laser having a distorted active layer, or a semiconductor laser injected with external TM-mode laser light, or a DFB (distributed feedback) semiconductor laser may be used.

A semiconductor laser whose active layer has distortion can produce TM-mode oscillations because of the increase in TM-mode gain caused by a band structure change due to such distortion.

A semiconductor laser injected with external TM-mode laser light can produce TM-mode oscillations because of the increase in TM-mode gain caused by such injection.

A DFB semiconductor laser can produce TM-mode oscillations because of the increase in TM-mode gain caused by means of grating designed to perform feedback to TM mode.

In the first to fourth embodiments, the semiconductor laser 10 may be replaced with a surface-emitting semiconductor laser. When using a surface-emitting semiconductor laser, arrangement must be made in order that the direction of polarization of the emitted semiconductor laser light agrees with the direction of TM-mode of the waveguide 14.

The invention claimed is:

1. A lasing system of a wavelength-conversion waveguide type, comprising:
   a self-sustained pulsation type semiconductor laser light source having an emitting portion for emitting a semiconductor laser light with TM (transverse magnetic)-mode oscillation from said emitting portion of said semiconductor light source by self-sustained pulsation;
   a wavelength-conversion waveguide having an incident portion for converting the emitted semiconductor laser light into a second harmonic light and for propagating said emitted semiconductor laser light;
   a focusing lens for focusing said semiconductor laser light emitted from said semiconductor laser light source on said incident portion of said wavelength-conversion waveguide;
   an external resonator composed of a couple of reflecting mirrors for resonating said semiconductor laser light emitted from said semiconductor laser light source; and
   an optical element having a Brewster face within said external resonator, said Brewster face being tilted so that the angle of incidence of a beam of emitted semiconductor laser light becomes a Brewster angle,
   wherein the direction of polarization of said semiconductor laser light emitted from said semiconductor laser light source is in alignment with the direction of p-polarized light of said Brewster face, thereby producing an improved lasing system generating short-wavelength second harmonic light such that semiconductor laser oscillation threshold current and differential efficiency do not increase.

2. The lasing system of a wavelength-conversion waveguide type according to claim 1, wherein said optical element is a Brewster plate.

3. The lasing system of a wavelength-conversion waveguide type according to claim 2, further comprising a band pass filter which is arranged within said external resonator and which has narrow-band-pass characteristics with respect to a wavelength of said semiconductor laser light emitted from said semiconductor laser light source.

4. The lasing system of a wavelength-conversion waveguide type according to claim 2, wherein a surface of said Brewster plate carries thereon a band pass filter layer which has narrow-band-pass characteristics with respect to a wavelength of said semiconductor laser light emitted from said semiconductor laser light source.

5. The lasing system of a wavelength-conversion waveguide type according to claim 1, wherein said focusing lens and said optical element compose a hemispherical lens whose flat end surface is said Brewster face.

6. The lasing system of a wavelength-conversion waveguide type according to claim 1, wherein
   said focusing lens and said optical element compose a spherical lens including a first hemispherical lens and a second hemispherical lens,
   a flat end surface of said first hemispherical lens is said Brewster face, and
   a flat end surface of said second hemispherical lens carries thereon a band pass filter layer which has narrow-band-pass characteristics with respect to a wavelength of said semiconductor laser light emitted from said semiconductor laser light source.

7. The lasing system of a wavelength-conversion waveguide type according to claim 1, wherein said semiconductor laser light source is a semiconductor laser having an active layer with a real refractive index waveguide structure.

8. The lasing system of a wavelength-conversion waveguide type according to claim 1, wherein said semiconductor laser light source is a semiconductor laser having an active layer with a distortion.

9. The lasing system of a wavelength-conversion waveguide type according to claim 1, wherein said semiconductor laser light source is a semiconductor laser capable of emitting semiconductor laser light with TM-mode oscillation upon receipt of external semiconductor laser light with oscillation in parallel with TM-mode oscillation.

10. The lasing system of a wavelength-conversion waveguide type according to claim 1, wherein said semiconductor laser light source is a DFB (distributed feedback) semiconductor laser.

11. A lasing system of a wavelength-conversion waveguide type, comprising:
    a self-sustained pulsation type semiconductor laser light source having an emitting portion for emitting a semiconductor laser light with TM (transverse magnetic)-mode oscillation from said emitting portion of said semiconductor light source by self-sustained pulsation;
    a wavelength-conversion waveguide having an incident portion for converting the emitted semiconductor laser light into a second harmonic light and for propagating said emitted semiconductor laser light;
    a focusing lens for focusing said semiconductor laser light emitted from said semiconductor laser light source on said incident portion of said wavelength-conversion waveguide at a Brewster angle; and
    an external resonator composed of a couple of reflecting mirrors for resonating said semiconductor laser light emitted from said semiconductor laser light source,
    said self-sustained pulsation type semiconductor laser light source arranged so that the direction of polarization of said semiconductor laser light emitted from said semiconductor laser light source in the TM mode is in alignment with the direction of TM mode of said wavelength-conversion waveguide,
    wherein said semiconductor laser light emitted from said semiconductor laser light source arrives at said incident portion of said wavelength-conversion waveguide with the Brewster angle, thereby producing an improved lasing system generating short-wavelength second harmonic light such that semiconductor laser oscillation threshold current and differential efficiency do no increase.

* * * * *